US012790686B2

(12) United States Patent
Parmar et al.

(10) Patent No.: US 12,790,686 B2

(45) Date of Patent: Nov. 10, 2026

(54) PURGING TOXIC AND CORROSIVE MATERIAL FROM SUBSTRATE PROCESSING CHAMBERS

(71) Applicant: LAM RESEARCH CORPORATION, Fremont, CA (US)

(72) Inventors: Ravi Parmar, San Jose, CA (US); Soonton Nuisud, Modesto, CA (US); Jonathan Pyle, San Jose, CA (US); Raymond Jonathans, San Jose, CA (US); Raees Amer Deen, San Jose, CA (US); Sai Rachakonda, Sunnyvale, CA (US); Nishant Chouhan, Livermore, CA (US); Jun-Hwa Park, Pleasanton, CA (US); Shawn Tokairin, Fremont, CA (US); Michael Rumer, Santa Clara, CA (US); Eunsuk Ko, San Jose, CA (US); Ashwin Agathya Boochakravarthy, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 18 days.

(21) Appl. No.: 19/118,866

(22) PCT Filed: Oct. 4, 2023

(86) PCT No.: PCT/US2023/034417

§ 371 (c)(1),
(2) Date: Apr. 7, 2025

(87) PCT Pub. No.: WO2024/081135

PCT Pub. Date: Apr. 18, 2024

(65) Prior Publication Data

US 2026/0139370 A1 May 21, 2026

Related U.S. Application Data

(60) Provisional application No. 63/414,703, filed on Oct. 10, 2022.

(51) Int. Cl.

| | |
|---|---|
| ***H10P 70/00*** | (2026.01) |
| ***C23C 16/44*** | (2006.01) |
| ***C23C 16/455*** | (2006.01) |

(52) U.S. Cl.

CPC ...... *C23C 16/4408* (2013.01); *C23C 16/4412* (2013.01); *C23C 16/45561* (2013.01)

(58) Field of Classification Search

CPC ............ C23C 16/4408; C23C 16/4412; C23C 16/45561; H10P 72/0402; H10P 72/0462;

(Continued)

(56) References Cited

U.S. PATENT DOCUMENTS

2011/0014797 A1 1/2011 Kawano et al.
2013/0192648 A1* 8/2013 Cho .......................... B08B 9/08 134/22.1

(Continued)

FOREIGN PATENT DOCUMENTS

CN 110835751 A 2/2020
KR 20120131400 A 12/2012

OTHER PUBLICATIONS

International Search Report and Written Opinion of the ISA issued in PCT/US2023/034417, mailed Jan. 23, 2024; ISA/KR.

*Primary Examiner* — Douglas Lee

(57) ABSTRACT

A system for performing preventive maintenance of a processing chamber of a substrate processing system using atmospheric air comprises a first plurality of valves and manifolds, a second plurality of valves and manifolds, and a controller. The first plurality of valves and manifolds are located downstream from the processing chamber. The second plurality of valves and manifolds are located upstream from the processing chamber. The controller is configured to perform the preventive maintenance by: initially purging the processing chamber and the first plurality of valves and manifolds while maintaining pressure in the processing (Continued)

chamber between a first pressure and a second pressure that is greater than the first pressure and less than atmospheric pressure, and subsequently purging the processing chamber and the second plurality of valves and manifolds while maintaining pressure in the processing chamber between the first pressure and a third pressure that is less than the first pressure.

18 Claims, 6 Drawing Sheets

(58) Field of Classification Search
CPC .. B08B 9/08; B08B 9/093; B08B 5/00; B08B 5/02; B08B 5/04
See application file for complete search history.

(56) References Cited

U.S. PATENT DOCUMENTS

2015/0045961 A1 2/2015 Koshti et al.
2018/0073137 A1* 3/2018 Xavier ................ C23C 16/4405
2020/0056724 A1 2/2020 Kimoto et al.

* cited by examiner

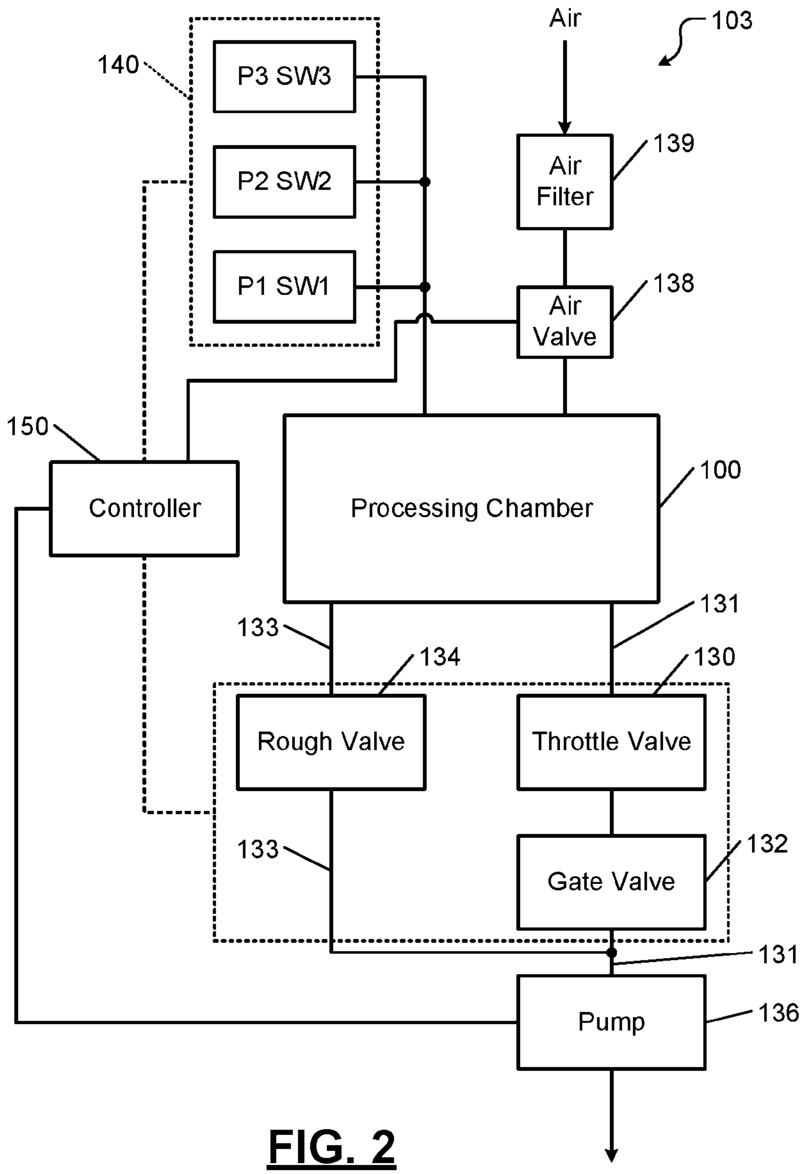

FIG. 2

| | |
|---|---|
| 1 | Close all valves |
| 2 | Open throttle and gate valves and Pump the chamber to base pressure |
| 3 | Open air valve and HP Valves downstream of the chamber |
| 4 | Open rough valve |
| 5 | Pump the chamber for specified purge time |
| 6 | Close air valve and pump the chamber to base pressure |
| 7 | Open LP valves upstream of the chamber |
| 8 | Open air valve, set throttle valve to Th2 |
| 9 | Once Th2 is reached, set throttle valve to Th1 |
| 10 | Repeat 8 and 9 for N cycles or for X amount of time |
| 11 | Pump the chamber to base pressure and close all valves |

FIG. 3

PURGING TOXIC AND CORROSIVE MATERIAL FROM SUBSTRATE PROCESSING CHAMBERS

CROSS-REFERENCE TO RELATED APPLICATIONS

This application is a U.S. National Phase Application under 35 U.S.C. 371 of International Application No. PCT/US2023/034417, filed on Oct. 4, 2023, which claims the benefit of U.S. Provisional Application No. 63/414,703, filed on Oct. 10, 2022. The entire disclosures of the applications referenced above are incorporated herein by reference.

FIELD

The present disclosure relates generally to substrate processing systems and more particularly to purging toxic and corrosive material from substrate processing chambers.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In substrate processing systems, various chemistries are used to process substrates in processing chambers. Some chemistries use toxic and corrosive elements and/or compounds containing elements such as fluorine. The processing chambers are continually purged during substrate processing using a vacuum pump coupled to the processing chambers. However, the processing chambers need to be periodically cleaned to remove the toxic and corrosive materials. These cleaning processes require human intervention and testing, which pose health hazards and also lengthen the cleaning processes.

SUMMARY

A system for performing preventive maintenance of a processing chamber of a substrate processing system using atmospheric air comprises a first plurality of valves and manifolds, a second plurality of valves and manifolds, and a controller. The first plurality of valves and manifolds are located downstream from the processing chamber of the substrate processing system. The second plurality of valves and manifolds are located upstream from the processing chamber of the substrate processing system. The controller is configured to perform the preventive maintenance of the processing chamber using the atmospheric air by: initially purging the processing chamber and the first plurality of valves and manifolds while maintaining pressure in the processing chamber between a first pressure and a second pressure that is greater than the first pressure and less than atmospheric pressure, and subsequently purging the processing chamber and the second plurality of valves and manifolds while maintaining pressure in the processing chamber between the first pressure and a third pressure that is less than the first pressure.

In additional feature, the controller is configured to remove hydrogen fluoride from the processing chamber, the first plurality of valves and manifolds, and the second plurality of valves and manifolds by perform the preventive maintenance of the processing chamber using the atmospheric air.

In additional feature, the controller is configured to perform the initial purging for a longer period of time than the subsequent purging.

In additional feature, the controller is configured to open the first plurality of valves and close the second plurality of valves while maintaining pressure in the processing chamber between the first pressure and the second pressure during the initial purging.

In additional feature, the controller is configured to open the second plurality of valves and close the first plurality of valves while maintaining pressure in the processing chamber between the first pressure and the third pressure during the subsequent purging.

In additional feature, the controller is configured to perform the initial purging and the subsequent purging at a first time, perform the initial purging and the subsequent purging at a second time that is subsequent to the first time, and perform only the subsequent purging one or more times between the first and second times.

In still other features, a method of performing preventive maintenance of a processing chamber of a substrate processing system using atmospheric air comprises initially opening a first plurality of valves located downstream from the processing chamber and closing a second plurality of valves located upstream from the processing chamber to perform the preventive maintenance while maintaining pressure in the processing chamber between a first pressure and a second pressure that is greater than the first pressure and less than atmospheric pressure. The method comprises purging the processing chamber and the first plurality of valves using the atmospheric air to perform the preventive maintenance while maintaining pressure in the processing chamber between the first pressure and the second pressure. The method comprises subsequently closing the first plurality of valves and opening the second plurality of valves to perform the preventive maintenance while maintaining pressure in the processing chamber between the first pressure and a third pressure that is less than the first pressure. The method comprises purging the processing chamber and the second plurality of valves using the atmospheric air to perform the preventive maintenance while maintaining pressure in the processing chamber between the first pressure and the third pressure.

In additional feature, the purging of the processing chamber, the first plurality of valves, and the second plurality of valves comprises removing hydrogen fluoride from the processing chamber, the first plurality of valves, the second plurality of valves, and manifolds associated with the first and second plurality of valves.

In additional feature, the method further comprises purging the processing chamber and the first plurality of valves for a longer period of time than purging the processing chamber and the second plurality of valves.

In additional features, the method further comprises initially performing, at a first time, a first instance of the purging of the processing chamber, the first plurality of valves, and the second plurality of valves. The method further comprises subsequently performing, at a second time, a second instance of the purging of the processing chamber, the first plurality of valves, and the second plurality of valves. The method further comprises performing only the purging of the processing chamber and the second plurality of valves one or more times between the first and second times.

In still other features, a system for performing preventive maintenance of a processing chamber of a substrate processing system using atmospheric air comprises a first plurality of valves and manifolds, a second plurality of valves and manifolds, a first valve, a throttle valve and a second valve, a third valve, a vacuum pump, and a controller. The first plurality of valves and manifolds are located downstream from the processing chamber. The second plurality of valves and manifolds are located upstream from the processing chamber. The first valve is configured to selectively flow the atmospheric air into the processing chamber. The throttle valve and the second valve are connected to each other in series and are connected to the processing chamber. The third valve is connected across the throttle valve and the second valve. The vacuum pump is connected to the throttle valve and the second and third valves. The controller is configured to perform the preventive maintenance by controlling the vacuum pump, the throttle valve, and the first, second, and third valves to: initially open the first plurality of valves and close the second plurality of valves while maintaining pressure in the processing chamber between a first pressure and a second pressure that is greater than the first pressure and less than atmospheric pressure, purge the processing chamber and the first plurality of valves and manifolds using the atmospheric air, subsequently close the first plurality of valves and open the second plurality of valves while maintaining pressure in the processing chamber between the first pressure and a third pressure that is less than the first pressure, and purge the processing chamber and the second plurality of valves and manifolds using the atmospheric air.

In additional feature, the controller is configured to remove hydrogen fluoride from the processing chamber, the first plurality of valves and manifolds, and the second plurality of valves and manifolds.

In additional feature, the controller is configured to purge the processing chamber and the first plurality of valves and manifolds for a longer period of time than purging the processing chamber and the second plurality of valves and manifolds.

In additional features, the controller is configured to initially perform, at a first time, a first instance of the purging of the processing chamber, the first plurality of valves and manifolds, and the second plurality of valves and manifolds; subsequently perform, at a second time, a second instance of the purging of the processing chamber, the first plurality of valves and manifolds, and the second plurality of valves and manifolds; and perform only the purging of the processing chamber and the second plurality of valves and manifolds one or more times between the first and second times.

In additional features, the controller is configured to close the throttle valve and the second valve and open the third valve in response to the pressure in the processing chamber being greater than or equal to the first pressure; and open the throttle valve and the second valve and close the third valve in response to the pressure in the processing chamber being less than the first pressure.

In additional features, the controller is configured to close the first and second plurality of valves, the throttle valve, and the first, second, and third valves; open the throttle valve and the second valve; pump, using the vacuum pump, the processing chamber to a first threshold pressure that is less than the first pressure and greater than the third pressure; open the first valve and the first plurality of valves; continue pumping the processing chamber and the first plurality of valves for a first predetermined period; close the first valve after the first predetermined period; and pump, using the vacuum pump, the processing chamber to the first threshold pressure.

In additional features, the controller is configured to, after the first predetermined period: close the first plurality of valves and open the second plurality of valves; open the first and third valves; a) pump the processing chamber using the vacuum pump with the throttle valve set to a second threshold pressure that is greater than the first threshold pressure and less than the first pressure; b) in response to the pressure in the processing chamber reaching the second threshold pressure, pump the processing chamber using the vacuum pump with the throttle valve set to the first threshold pressure; repeat a) and b) a predetermined number of times or for a second predetermined period that is less than the first predetermined period; and close the first and second plurality of valves, the throttle valve, and the first, second, and third valves.

In additional features, the controller is configured to purge the processing chamber and the first and second plurality of valves and manifolds at a first time and purge the processing chamber and the first and second plurality of valves and manifolds at a second time that is subsequent to the first time. Between purging the processing chamber and the first and second plurality of valves and manifolds at the first and second times, the controller is configured to: close the first and second plurality of valves, the throttle valve, and the first, second, and third valves; open the throttle valve and the second valve; pump, using the vacuum pump, the processing chamber to a first threshold pressure that is less than the first pressure and greater than the third pressure; close the throttle valve and the second valve; open the second plurality of valves; open the first and third valves; a) pump the processing chamber using the vacuum pump with the throttle valve set to a second threshold pressure that is greater than the first threshold pressure and less than the first pressure; b) in response to the pressure in the processing chamber reaching the second threshold pressure, pump the processing chamber using the vacuum pump with the throttle valve set to the first threshold pressure; repeat a) and b) a predetermined number of times or for a predetermined period; and close the first and second plurality of valves, the throttle valve, and the first, second, and third valves.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2 shows a system for purging hydrogen fluoride (HF) from the processing chamber and the high- and low-pressure valves in the substrate processing system of FIG. 1 according to the present disclosure;

FIGS. 3 and 4 show operations performed during the purging of HF from the processing chamber and the high- and low-pressure valves according to the present disclosure;

In the drawings, reference numbers may be reused to identify similar and/or identical elements.

DETAILED DESCRIPTION

Figure 1:
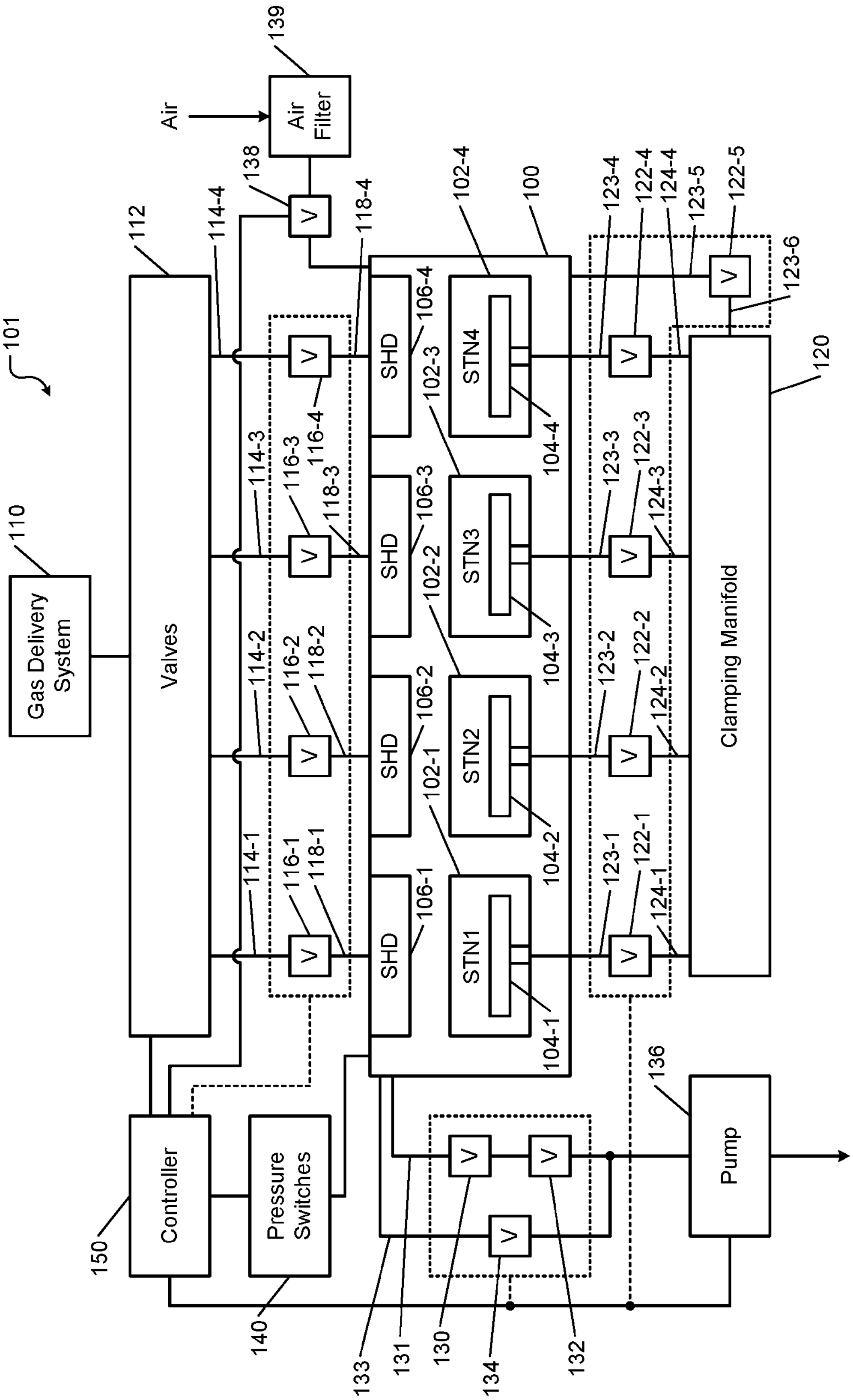
FIG. 1 shows an example of a substrate processing system comprising an example of a processing chamber and examples of the high- and low-pressure valves.

Processing chambers are periodically cleaned (e.g., during preventive maintenance). Some processes performed in the processing chambers use chemistries comprising fluorine during substrate processing. Although the processing chamber is purged repeatedly during substrate processing, some amount of fluorine remains in the processing chamber, and in valves and associated manifolds upstream and downstream from the processing chamber, which are described below in detail. After shutting down and cleaning the processing chamber during preventive maintenance to remove the remaining fluorine, any residual fluorine lingering in the processing chamber and in the valves and associated manifolds needs to be removed from the processing chamber. To remove any lingering residual fluorine from the processing chamber and in the valves and associated manifolds, atmospheric air is allowed to enter into the processing chamber during preventive maintenance while contents of the processing chamber are pumped out through an exhaust system.

During preventive maintenance, any residual fluorine lingering in the processing chamber and in the valves and associated manifolds reacts with moisture in the atmospheric air and forms hydrogen fluoride (HF), which is hazardous (i.e., toxic and corrosive) if inhaled or touched. The process of letting air into the processing chamber and pumping out the contents of the processing chamber including HF during preventive maintenance is called HF purging. The systems and methods of the present disclosure for purging hazardous materials from the processing chamber during preventive maintenance are distinct from (i.e., different than and separate from) purging of the processing chamber performed during normal operation of the processing chamber (e.g., during substrate processing).

Throughout the present disclosure, HF is used only as an example of toxic and corrosive (i.e., hazardous) materials that can be removed from the processing chamber and the valves and associated manifolds using the purging performed during preventive maintenance according to the present disclosure. Depending on the chemistries used in processes performed during normal operation of the processing chamber (e.g., during substrate processing), the systems and methods of the present disclosure can be used to remove any other toxic and corrosive residual materials that may remain in the processing chamber and in the valves and associated manifolds after the chemistry has been purged during the normal operation and that may form hazardous materials upon reacting with air used in the purging performed during preventive maintenance.

For example, the other materials may comprise hydrogen chloride (HCL) that may be formed when chlorine-containing chemistry is used during normal operation and when any residual chlorine reacts with moisture in the air to form HCL during preventive maintenance. In general, materials such as HF and HCL are called halogen-containing residues and are examples of the hazardous materials that can be removed from the processing chamber and from the valves and associated manifolds using the purging performed during preventive maintenance according to the present disclosure. However, the present disclosure is not limited to removing halogen-containing residues but is applicable to remove any hazardous materials that may form in the processing chamber and in the valves and associated manifolds due to the reaction of residual materials, which may remain in the processing chamber and in the valves and associated manifolds from the unpurged chemistries used during normal operation, with air used in the purging performed during preventive maintenance.

After performing the HF purging for several hours, an operator wearing a protective gear opens the processing chamber and uses a detector to check HF level in the processing chamber. If the detected HF level is above a safe limit, the HF purging process is repeated. The HF purging process takes a long time, which increases downtime of the processing chamber. The HF purging process also requires manual testing of HF levels in the processing chamber, which endangers operators.

The present disclosure provides an HF purging method that solves the above problems. The HF purging method of the present disclosure comprises high pressure purging (also called coarse purging) and low-pressure purging (also called fine purging) of the processing chamber. As explained below in detail, the coarse purging comprises cleaning the processing chamber and only those valves and associated piping that operate at high pressure during normal operation of the processing chamber. These high-pressure valves and associated piping are typically located downstream from the processing chamber. The fine purging comprises cleaning the processing chamber and only those valves and associated piping that operate at low pressure during normal operation of the processing chamber. These low-pressure valves and associated piping are typically located upstream from the processing chamber and include valves and piping up to but not including the gas delivery system (called a gas box). The gas box is cut off (i.e., isolated) from the processing chamber during the cleaning of the processing chamber by closing an isolation valve associated with the gas box.

Both the coarse and fine purging are performed when the processing chamber is cleaned periodically. When both the coarse and fine purging are performed, the fine purging is performed following the coarse purging. However, depending on the frequency at which the processing chamber is cleaned, both the coarse and fine purging need not be always performed together to clean the processing chamber. For example, if the processing chamber is cleaned frequently, only the fine purging can be performed one or more times between successive instances of the coarse and fine purging. While the coarse purging can also be performed without performing the fine purging thereafter, the fine purging is preferably always performed after each coarse purging.

The coarse and fine purging are performed automatically (i.e., without an operator's intervention and testing). The coarse purging removes most of the HF from the processing chamber. The fine purging removes residual traces of the HF from the processing chamber that may remain in the processing chamber after the coarse purging so that the HF level in the processing chamber is below the safe level and can be safely tested if needed. The HF purging method of the present disclosure takes shorter time than the purging methods requiring operator's intervention and testing. Further, the number of cycles in the fine purging or the duration of the fine purging (explained below) can be tuned so that at the end of the fine purging, the HF level in the processing chamber is below the safe level and can be safely tested if needed.

The HF purging (i.e., both the coarse and fine purging of HP) according to the present disclosure is performed only during preventive maintenance. The HF purging is not performed during substrate processing (i.e., during normal operation or use of the processing chamber to process substrates). The HF purging according to the present disclosure is also not performed between processing of substrates in the processing chamber. Therefore, the HF purging according to the present disclosure is distinct from any other purging performed during substrate processing.

Figure 4:
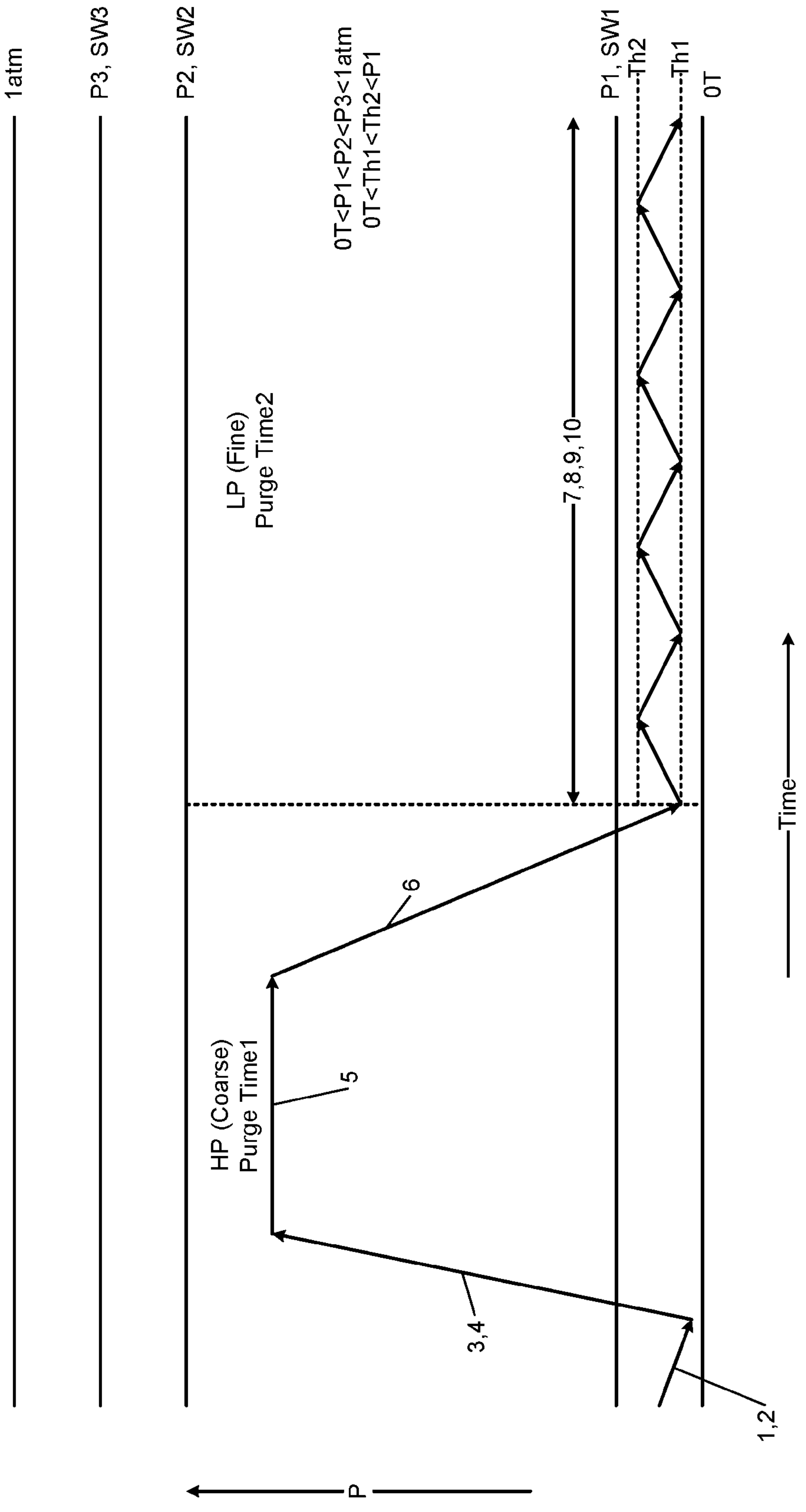
Figure 5:
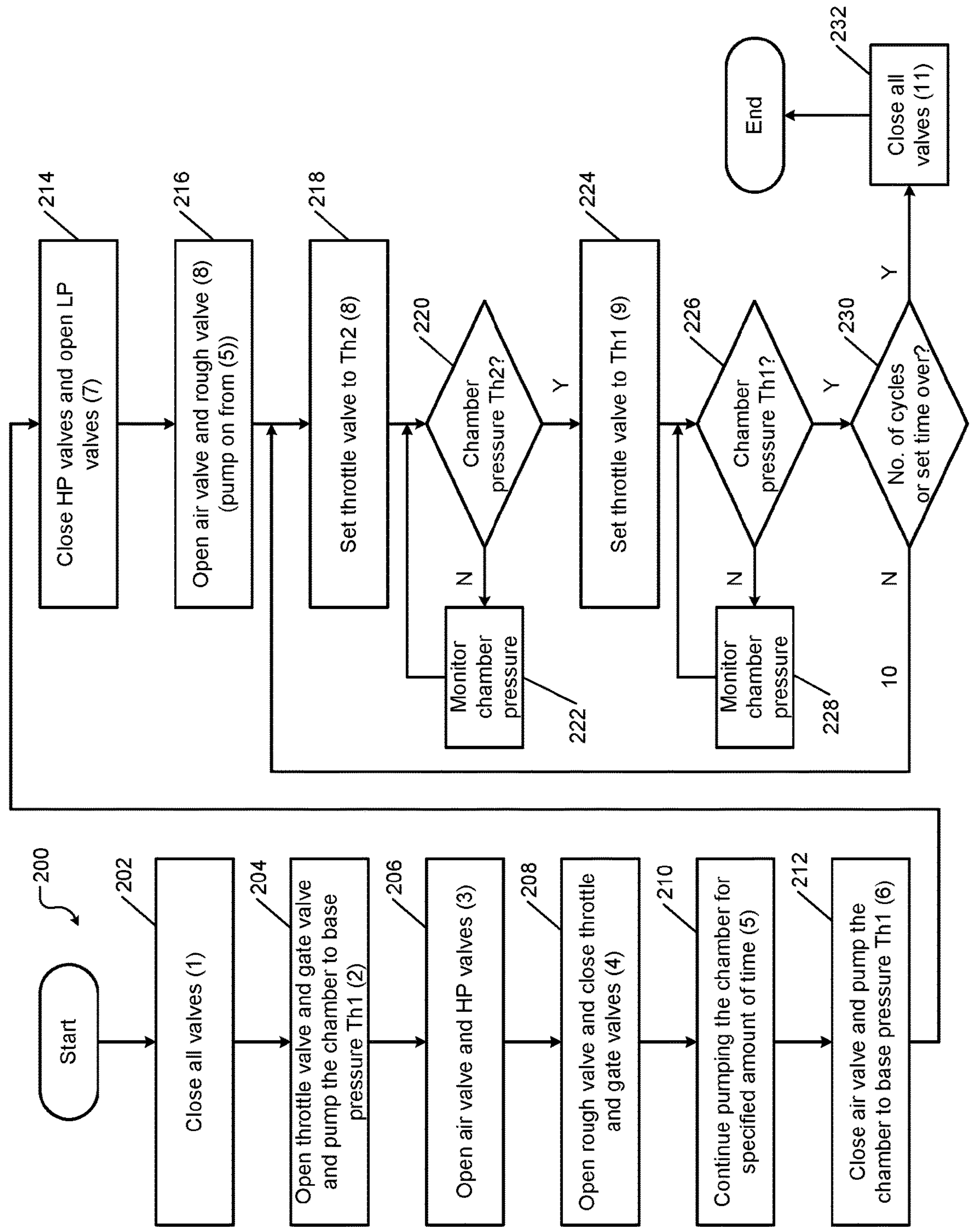
FIG. 5 shows a method of purging the HF from the processing chamber and the high- and low-pressure valves according to the present disclosure.
Figure 6:
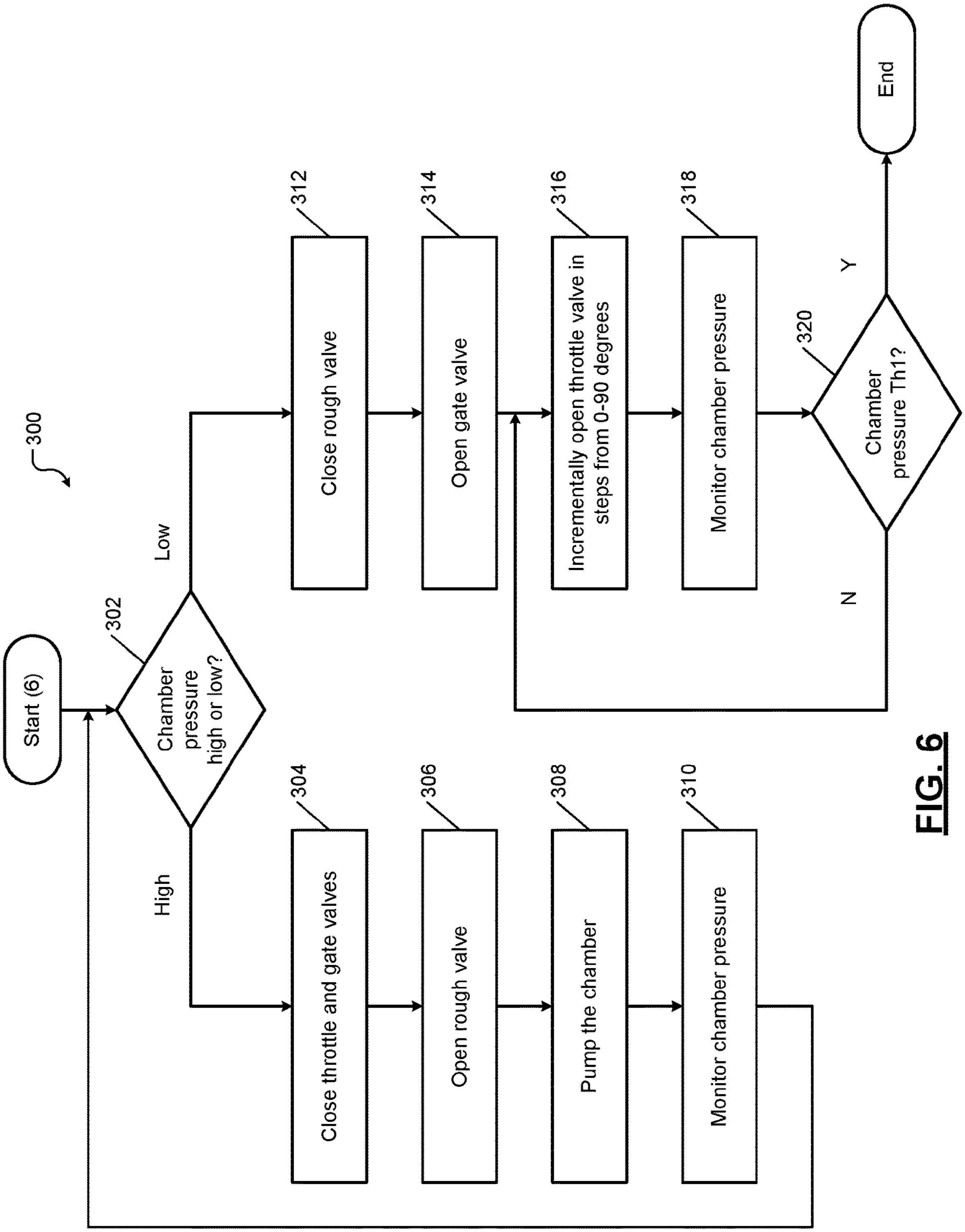
FIG. 6 shows a method of pumping the processing chamber during the HF purging using a combination of a rough valve, a throttle valve, and a gate valve of the systems shown in FIGS. 1 and 2.
Figure 7:
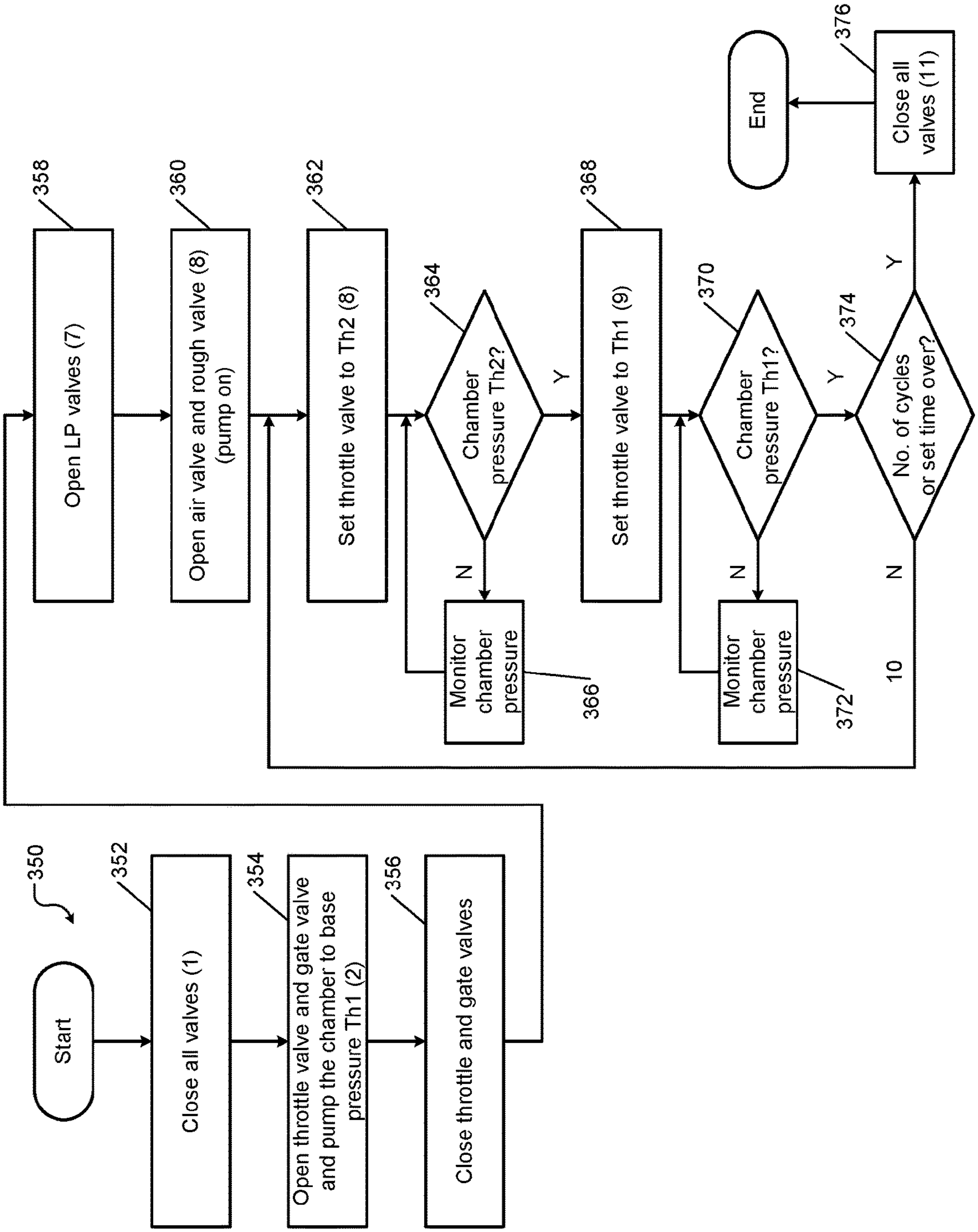
FIG. 7 shows a method of performing only a fine purging portion of the HF purging according to the present disclosure when the HF purging is performed frequently.

The present disclosure is organized as follows. Before explaining the HF purging method of the present disclosure, an example of a substrate processing system comprising an example of a processing chamber and examples of the high- and low-pressure valves, is shown and described with reference to FIG. 1. FIG. 2 shows a system for performing the HF purging comprising portions of the substrate processing system of FIG. 1 that are relevant to the HF purging described with reference to FIGS. 3-7. FIGS. 3 and 4 show operations performed during the HF purging. FIG. 5 shows a method of performing the HF purging. FIG. 6 shows a method of pumping the processing chamber using a combination of a rough valve and throttle and gate valves (all described below). FIG. 7 shows a method of performing only the fine purging when the HF purging is performed frequently.

FIG. 1 shows an example of a substrate processing system 101. For example, the substrate processing system 101 comprises a processing chamber 100 and a plurality of high- and low-pressure valves (described below). For example, the processing chamber 100 comprises four stations STN1 102-1, STN2 102-2, STN3 102-3, and STN4 102-4 (collectively the stations 102). While four stations are shown for example, the processing chamber 100 may any number of stations.

One or more substrates (now shown) can be processed in the stations 102 using one or more processes. For example, the processes may include a deposition process used to deposit material on a substrate or an etching process used to remove material from a substrate. In some processes, a substrate may be transferred from station to station in a sequence by a computer-controlled robot (not shown) and may be processed sequentially in the stations 102. Alternatively, in some processes, four substrates may be processed concurrently in four stations, respectively.

Each station 102 comprises a pedestal 104 (shown at 104-1, 104-2, 104-3, and 104-4) to support a substrate (not shown) during processing. Each station 102 comprises a showerhead SHD 106 (shown at 106-1, 106-2, 106-3, and 106-4) to supply one or more gases into the stations 102 during substrate processing. The showerheads 106 are attached to a top plate (not shown) of the processing chamber 100. In some processes, while not shown, plasma may be struck during substrate processing.

A gas delivery system 110 supplies various gases to the processing chamber 100. For example, the various gases may include process gases, precursors, purge gases (e.g., insert gases), cleaning gases, and so on. The gas delivery system 110 supplies the various gases to the processing chamber 100 through various valves and manifolds (also called conduits or piping) as follows.

The gas delivery system 110 is connected to a plurality of valves 112. The valves 112 are connected by a plurality of manifolds 114 (shown at 114-1, 114-2, 114-3, and 114-4) to a plurality of valves 116 (shown at 116-1, 116-2, 116-3, and 116-4). The valves 116 are connected to the showerheads 106 by a plurality of manifolds 118 (shown at 118-1, 118-2, 118-3, and 118-4). The valves 112, 116 and the manifolds 114, 118 are located above the top plate of the processing chamber 100 (i.e., upstream from the processing chamber 100).

During the HF purging and substrate processing (i.e., normal operation or use of the processing chamber 100 to process substrates), the valves 112, 116 are opened only when the pressure in the processing chamber 100 is low (e.g., less than P1, near vacuum, shown in FIG. 4). Accordingly, the valves 112, 116 and the manifolds 114, 118 are respectively called low-pressure (LP) valves and LP manifolds and are used as non-limiting examples of LP valves and LP manifolds in the substrate processing system 101 throughout the present disclosure.

The stations 102 are connected to a clamping manifold 120 through respective valves 122 (shown at 122-1, 122-2, 122-3, and 122-4) and manifolds 123 (shown at 123-1, 123-2, 123-3, and 123-4). The valves 122 are connected to the clamping manifold 120 by respective manifolds 124 (shown at 124-1, 124-2, 124-3, and 124-4). An additional valve 122-5 is connected between the processing chamber 100 and the clamping manifold 120 by respective manifolds 122-5 and 122-6. The valve 122-5 equalizes pressures in the clamping manifold 120 and the processing chamber 100. The valves 122-1, 122-2, 122-3, 122-4, and 122-5 are collectively called the valves 122. The manifolds 123-1, 123-2, 123-3, 123-4, 123-5, and 123-6 are collectively called the manifolds 123. The valves 122 and the manifolds 123, 124 are located under the processing chamber 100 (i.e., downstream from the processing chamber 100).

For example, the valves 122 and the manifolds 123, 124, which are located downstream from the processing chamber 100, are called a first plurality of valves and manifolds. The valves 112, 116 and the manifolds 114, 118, which are located upstream from the processing chamber 100, are called a second plurality of valves and manifolds.

During the HF purging and substrate processing (i.e., normal operation of the processing chamber 100), the valves 122 are opened only when the pressure in the processing chamber 100 is high (e.g., P2, which is greater than P1 as shown in FIG. 4). Accordingly, the valves 122 and the manifolds 120, 123, 124 are respectively called high-pressure (HP) valves and HP manifolds and are used as non-limiting examples of HP valves and HP manifolds in the substrate processing system 101 throughout the present disclosure.

To evacuate the processing chamber 100, a plurality of valves 130, 132, and 134 are connected to the processing chamber 100 and to a vacuum pump 136. The valve 130 is a throttle valve 130. The valve 132 is a gate valve 132. The valve 134 is a rough valve 134. The throttle valve 130 can be opened and closed gradually (e.g., in steps). The gate valve 132 and the rough valve 134 are an on/off valves. The rough valve 134 is smaller than the gate valve 132. The throttle valve 130 and the gate valve 132 are connected in series to each other. The rough valve 134 is connected across (in parallel to) the throttle valve 130 and the gate valve 132. The valves 130, 132, and 132 are also located downstream from the processing chamber 100.

The throttle valve 130 and the gate valve 132 are connected to a main foreline 131 (shown in FIG. 2) connecting the processing chamber 100 to the vacuum pump 136. The gate valve 132 is located downstream from the throttle valve 130 in the main foreline 131. One end of the rough valve 134 is connected to a secondary foreline 133 that is connected to the processing chamber 100. The other end of the rough valve 134 is connected to the main foreline 131 subsequent to the gate valve 132. The main foreline 131 is many times larger than the secondary foreline 133. For example, the main foreline 131 may be four inches in diameter while the secondary foreline 133 may be a quart of an inch in diameter.

The operation of the valves 130, 132, and 134 is described below in further detail with reference to FIGS. 3-7. Briefly, when the pressure in the processing chamber 100 is high (e.g., P2 or P3 shown in FIG. 4, which is near atmospheric pressure during HF purging described below, or before beginning substrate processing during normal operation), the rough valve 134 is initially opened (with the throttle valve 130 and the gate valve 132 closed) to gradually (slowly) lower the pressure in the processing chamber 100 using the vacuum pump 136 to less than or equal to P1 (shown in FIG. 4). Thus, the initial load on the vacuum pump 136 to decrease the pressure in the processing chamber 100 from a high pressure to a low pressure is reduced. Subsequently, after the pressure in the processing chamber 100 is decreased to less than or equal to P1, the throttle valve 130 and the gate valve 132 are opened to further decrease the pressure in the processing chamber 100 using the vacuum pump 136 during HF purging as described below, or to near vacuum before beginning substrate processing during normal operation.

To perform the HF purging according to the present disclosure, a valve 138 is connected to the processing chamber 100. The valve 138 (also called the air valve 138) is connected to an air filter 139. During the HF purging, the air valve 138 is opened to allow air to flow into the processing chamber 100 via the air filter 139 as described below in detail. The air filter 139 is designed to remove contaminants including moisture from the air before the air enters into the processing chamber 100.

A plurality of pressure switches 140 is connected to the processing chamber 100. The switches 140 are configured to activate at different pressures in the processing chamber 100. Upon activation, the switches 140 activate some of the valves and deactivate other valves as described below in detail. Briefly, when the pressure in the processing chamber 100 is less than P1 (shown in FIG. 4) (e.g., P1=100 Torr), a first switch (e.g., SW1 shown in FIG. 2) turns on all of the valves located upstream from the processing chamber 100 so that the gases from the gas delivery system 110 can be supplied to the processing chamber 100. Conversely, when the pressure in the processing chamber 100 is greater than or equal to P1, the first switch (e.g., SW1 shown in FIG. 2) turns off all of the valves located upstream from the processing chamber 100 so that none of the gases from the gas delivery system 110 is supplied to the processing chamber 100.

After the air valve 138 is opened, the pressure in the processing chamber 100 increases. A second switch (e.g., SW2 shown in FIG. 2) is configured to turn off the air valve 138 as the pressure in the processing chamber 100 increases to a pressure P2 (shown in FIG. 4) (e.g., P2=570 Torr), which is closer to atmospheric pressure (i.e., 1 atm or 760 Torr). If the second switch SW2 is unable to turn off the air valve 138 (e.g., due to a failure of the second switch SW2 and/or software in a controller 150 described below), as the pressure in the processing chamber 100 increases further and reaches a pressure P3 (shown in FIG. 4) (e.g., P3=650 Torr), a third switch SW3 (shown in FIG. 4) is configured (e.g., hardwired) to directly turn off the air valve 138 to prevent the pressure in the processing chamber 100 from increasing further. The operation of the pressure switches 140 is described below in further detail with reference to FIGS. 2-7.

A controller 150 is connected to all of the valves described above, the switches 140, and the vacuum pump 136. The controller 150 controls the operations of these elements as described above and as described below in further detail.

FIG. 2 shows a system 103 for performing the HF purging according to the present disclosure. The system 103 comprises portions of the substrate processing system 101 of FIG. 1 that are relevant to performing the HF purging as described below with reference to FIGS. 3-7. The system 103 comprises the processing chamber 100; the valves 130, 132, 134, 138; the air filter 139; the vacuum pump 136, the pressure switches 140 comprising the switches SW1, SW2, SW3; and the controller 150. The connections of these elements are already described above with reference to FIG. 1 and are therefore not repeated for brevity. The operations of these elements to perform the HF purging are now described in detail with reference to FIGS. 3-7.

FIG. 3 shows a table summarizing the steps performed by the controller 150 during the HF purging according to the present disclosure. The steps are numbered 1-11 and are described below in detail with reference to FIGS. 4-7. The steps 1-11 are graphically shown in FIG. 4 and described in detail with reference to FIGS. 5-7.

As FIG. 4 shows, the HF purging is performed in two stages or phases: a high-pressure purging (HP) comprising steps 1-6 and a low-pressure (LP) purging comprising steps 7-9. During the HP purging, the pressure in the processing chamber 100 is between near vacuum and less than one atmosphere (i.e., between 0 Torr and 1 atm or 760 Torr). During the LP purging, the pressure in the processing chamber 100 is between near vacuum and less than P1 (e.g., between 0 Torr and less than 100 Torr).

FIG. 5 shows a method to perform the HF purging according to the steps 1-11 shown in FIGS. 3 and 4 using the systems 101, 103 shown in FIGS. 1 and 2. FIG. 6 shows a method of pumping the processing chamber 100, which uses a combination of the rough valve 134, the throttle valve 130, and the gate valve 132, and which is used during the method of FIG. 5. FIG. 7 shows a method of performing only the fine purging without performing the coarse purging between successive HF purges when the HF purging is performed frequently. For example, the controller 150 performs the methods shown in FIGS. 5-7. The HF purging performed according to the present disclosure is now described in detail with reference to FIG. 5 while also referring to FIGS. 1-4.

FIG. 5 shows a method 200 of performing the HF purging comprising the coarse and fine purging described above. The method 200 initially performs the coarse purging and subsequently performs the fine purging as follows. The coarse purging may also be called a first stage or first phase of the HF purging. The fine purging may also be called a second stage or second phase of the HF purging. The coarse purging removes the HF from the high-pressure valves (e.g., the valves 122) and associated manifolds (e.g., the manifolds 120, 123, 124) located downstream from the processing chamber 100. The fine purging removes the HF from the low-pressure valves (e.g., the valves 112, 116) and associated manifolds (e.g., the manifolds 114, 119) located upstream from the processing chamber 100.

At 202, to begin the coarse purging of the processing chamber 100 during preventive maintenance, the controller 150 closes all the valves in the substrate processing system 101 (step 1 shown in FIGS. 3 and 4).

At 204, the controller 150 opens the throttle valve 130 and the gate valve 132. Additionally, the controller 150 turns on the vacuum pump 136 to pump the processing chamber 100 to a base pressure Th1 (i.e., a first threshold pressure Th1), which is less than P1 (step 2 shown in FIGS. 3 and 4). For example, the base pressure Th1 may be near vacuum or slightly greater than vacuum (e.g., P1=100 Torr, Th1=10 or 5 Torr).

At 206, the controller 150 opens the air valve 138 and all of the high-pressure valves (e.g., the valves 122) located downstream from the processing chamber 100 in the substrate processing system 101. Atmospheric air flows through the air filter 139 and the air valve 138 into the processing chamber 100. The pressure in the processing chamber 100 increases (e.g., to greater than P1 as shown in FIG. 4) (step 3 shown in FIGS. 3 and 4).

At 208, the controller 150 opens the rough valve 134. Additionally, the controller 150 closes the throttle valve 130 and the gate valve 132 (step 4 shown in FIGS. 3 and 4). The pressure in the processing chamber 100 reaches a pressure that is greater than P1 and less than P2 as shown in FIG. 4 (step 4 shown in FIGS. 3 and 4).

At 210, the vacuum pump 136 continues to pump (i.e., evacuate) the processing chamber 100 for a first specified (predetermined) amount of time (step 5 shown in FIGS. 3 and 4). The first specified (predetermined) amount of time is called a high-pressure purge time or a coarse purge time (also called a first predetermined purge time, shown as HP (coarse) purge Time1 in FIG. 4). For example, the HP (coarse) purge Time1 can be on the order a few hours (e.g., 4-6 hours). The HP (coarse) purge Time1 is calibrated depending on the processes that have been performed in the processing chamber 100 before performing the HF purging during preventive maintenance. During the HP (coarse) purge Time1, since only the rough valve 134 is open and the throttle valve 130 and the gate valve 132 are closed, the load on the vacuum pump 136 to pump the processing chamber 100 is low.

At 212, after the HP (coarse) purge Time1 elapses, the controller 150 closes the air valve 138. The vacuum pump 136 continues to the pump (i.e., evacuate) the processing chamber 100 until the pressure in the processing chamber 100 is reduced from the high pressure (above P1 during the HP (coarse) purge Time1 shown in FIG. 4) to a low pressure (Th1 shown in FIG. 4) (step 6 shown in FIGS. 3 and 4). At this point, the coarse purging of the processing chamber 100 ends, and the HF in all of the HP valves (e.g., the valves 122) and the associated manifolds (e.g., the manifolds 120, 123, 124) that are located downstream from the processing chamber 100 in the substrate processing system 101 is purged.

Throughout the coarse purging, since the pressure in the processing chamber 100 is greater than P1 (where $0<P1$ as shown in FIG. 4), the switch SW1 does not allow any of the LP valves (e.g., the valves 112, 116) that are located upstream from the processing chamber 100 to open. Instead, the switch SW1 allows only the HP valves (e.g., the valves 122) that are located downstream from the processing chamber 100 to remain open. Accordingly, the HP valves (e.g., the valves 122) and the associated manifolds (e.g., the manifolds 120, 123, 124 that are located downstream from the processing chamber 100 can be purged of the HF during the coarse purging.

In addition, during the coarse purging, the switch SW2 closes the air valve 138 if the pressure in the processing chamber 100 increases to greater than P2 as described above (where $0<P1<P2$ as shown in FIG. 4). Alternatively, if the switch SW2 fails to close the air valve 138 when the pressure in the processing chamber 100 increases to greater than P2, the switch SW3 closes the air valve 138 when the pressure in the processing chamber 100 reaches P3 as described above (where $0<P1<P2<P3<1$ atm as shown in FIG. 4).

At 214, following the coarse purging, to begin the fine purging of the processing chamber 100 during the preventive maintenance, the controller 150 closes all of the HP valves (e.g., the valves 122) that are located downstream from the processing chamber 100 in the substrate processing system 101. Additionally, the controller 150 opens all of the LP valves (e.g., the valves 112, 116) that are located upstream from the processing chamber 100 (step 7 shown in FIGS. 3 and 4).

At 216, the controller 150 opens the air valve 138 and the rough valve 134 (step 8 shown in FIGS. 3 and 4). The controller 150 also opens the gate valve 132 but controls the throttle valve 130 as described below. The vacuum pump 136 is already turned on in step 210 (step 5 shown in FIGS. 3 and 4). The pressure in the processing chamber 100, which is Th1 at the beginning of the fine purging (see end of step 6 and beginning of step 7 shown in FIGS. 3 and 4), begins to increase.

At 218, to increase the pressure in the processing chamber 100, the controller 150 sets the opening of the throttle valve 130 to a first setting corresponding to a pressure Th2 (i.e., a second threshold pressure Th1) that is to be reached in the processing chamber 100 (step 8 shown in FIGS. 3 and 4). The pressure Th2 is greater than the pressure Th1 but less than the pressure P1 as shown in FIG. 4. For example, P1=100 Torr, Th1=10 or 5 Torr, and Th2=80 or 90 Torr as shown in FIG. 4. Due to the first setting of the throttle valve 130, the pressure in the processing chamber 100 continues to increase from Th1 to Th2. The vacuum pump 136, which is already turned on in step 210 (step 5 shown in FIGS. 3 and 4), continues to the pump the processing chamber 100. As shown in FIG. 4, $0<Th1<Th2<P1$.

At 200, the controller 150 determines if the pressure in the processing chamber 100 has increased to Th2. At 222, the controller 150 continues to monitor the pressure in the processing chamber 100. The throttle valve 130 remains at the first setting until the pressure in the processing chamber 100 has increased to the pressure Th2. The vacuum pump 136, which is already turned on in step 210 (step 5 shown in FIGS. 3 and 4), continues to the pump the processing chamber 100.

At 224, after the pressure in the processing chamber 100 has increased to Th2, to decrease the pressure in the processing chamber 100 from Th2 to Th1, the controller 150 sets the throttle valve 130 to a second setting corresponding to the pressure Th1 (i.e., the first threshold pressure Th1) that is to be reached in the processing chamber 100 (step 9 shown in FIGS. 3 and 4). The vacuum pump 136, which is already turned on in step 210 (step 5 shown in FIGS. 3 and 4), continues to the pump the processing chamber 100.

At 226, the controller 150 determines if the pressure in the processing chamber 100 has decreased to Th1. At 228, controller 150 continues to monitor the pressure in the processing chamber 100. The throttle valve 130 remains at the second setting until the pressure in the processing chamber 100 has decreased to the pressure Th1. The vacuum pump 136, which is already turned on in step 210 (step 5 shown in FIGS. 3 and 4), continues to the pump the processing chamber 100.

At 230, the controller 150 determines if a cycle comprising the steps 218-228 has been performed for a predetermined number of times or for a second specified (predetermined) period of time. Performing the cycle comprising the steps 218-228 the predetermined number of times or for the second specified (predetermined) period of time is sufficient to purge the HF from all of the LP valves (e.g., the valves 112, 116) and the associated manifolds (e.g., the manifolds 114, 118) that are located upstream from the processing chamber 100.

If the cycle comprising the steps 218-228 has not yet been performed the predetermined number of times or for the second specified (predetermined) period of time, the controller 150 repeats the cycle comprising the steps 218-228 for the predetermined number of times or for the second specified (predetermined) period of time (step 10 shown in FIGS. 3 and 4). The vacuum pump 136, which is already turned on in step 210 (step 5 shown in FIGS. 3 and 4), continues to the pump the processing chamber 100.

If the cycle comprising the steps 218-228 has been performed for the predetermined number of times or for the second specified (predetermined) period of time, at 232, the controller 150 closes all of the valves in the substrate processing system 101 and turns off the vacuum pump 136 (step 11 shown in FIGS. 3 and 4). At this point, the fine purging of the processing chamber 100 ends, and the HF in all of the LP valves (e.g., the valves 112, 116) and the associated manifolds (e.g., the manifolds 114, 118) that are located upstream from the processing chamber 100 in the substrate processing system 101 is purged.

The second specified (predetermined) amount of time for which the fine purging of the processing chamber 100 is performed is called a low-pressure purge time or a fine purge time (also called a second predetermined purge time, shown as LP (fine) purge Time2 in FIG. 4). For example, the LP (fine) purge Time2 can be on the order a few minutes (e.g., less than one hour). Accordingly, the LP (fine) purge Time2 is much shorter than the HP (coarse) purge Time1. The LP (fine) purge Time2 is also calibrated depending on the processes that have been performed in the processing chamber 100 before performing the HF purging during preventive maintenance. For example, the number of cycles to be performed during the fine purging or the duration of the fine purging (i.e., the LP (fine) purge Time2) can be tuned so that at the end of the fine purging, the HF level in the processing chamber is below the safe level and can be safely tested if needed.

Throughout the fine purging, since the pressure in the processing chamber 100 less than P1, the switch SW1 does not allow any of the HP valves (e.g., the valves 122) that are located downstream from the processing chamber 100 to open. Instead, the switch SW1 allows only the LP valves (e.g., the valves 112, 116) that are located upstream from the processing chamber 100 to remain open. Accordingly, the LP valves (e.g., the valves 112, 116) and the associated manifolds (e.g., the manifolds 114, 118) that are located upstream from the processing chamber 100 can be purged of the HF during the fine purging.

FIG. 6 shows a method 300 of pumping (i.e., evacuating) the processing chamber 100 using a combination of the rough valve 134 and the throttle valve 130 and the gate valve 132 according to the present disclosure. The method 300 is used during the coarse purging portion (e.g., in step 6 shown in FIGS. 3 and 4) and during the fine purging (e.g., in steps 8-10 shown in FIGS. 3 and 4) portion of the method 200.

At 302, the controller 150 determines if the pressure in the processing chamber 100 is high (e.g., greater than P1) or low (e.g., less than P1). If the pressure in the processing chamber 100 is high (e.g., greater than P1), at 304, the controller 150 closes the throttle valve 130 and the gate valve 132. At 306, the controller 150 opens the rough valve 134. At 308, the controller 150 turns on the vacuum pump 136 (if not on), which pumps the processing chamber 100. At 310, the controller 150 monitors the pressure in the processing chamber 100, and the method 300 returns to 302.

Since only the rough valve 134 is open and the throttle valve 130 and the gate valve 132 are closed, the load on the vacuum pump 136 to decrease the pressure in the processing chamber 100 from the high pressure (e.g., greater than P1) to a low pressure (e.g., less than P1) is low.

Conversely, at 302, if the pressure in the processing chamber 100 is low (e.g., less than P1), at 312, the controller 150 closes the rough valve 134. At 314, the controller opens the gate valve 132. At 316, the controller 150 incrementally opens the throttle valve 130 in steps from 0-90 degrees. The controller 150 turns on the vacuum pump 136 (if not on), which pumps the processing chamber 100.

At 318, the controller 150 monitors the pressure in the processing chamber 100. At 320, the controller 150 determines if the pressure in the processing chamber 100 has decreased to Th1 (e.g., from P1 or Th2). If not, the controller 150 repeats the steps 316-320. The method 300 ends when the pressure in the processing chamber 100 has decreased to Th1.

FIG. 7 shows a method 350 for performing only the fine purging when the HF purging (i.e., the coarse purging followed by the fine purging) according to the method 200 shown in FIG. 5 is performed frequently. The method 350 of fine purging can be performed between subsequent HF purges if the HF purges are performed frequently according to the method 200 shown in FIG. 5. When the HF purging is performed frequently according to the method 200 shown in FIG. 5, the coarse purging can be omitted between successive HF purges, and only the fine purging can be performed between the successive HF purges performed frequently according to the method 200 shown in FIG. 5. The fine purging according to the method 350 is performed as follows.

At 352, to begin the fine purging of the processing chamber 100 during preventive maintenance, the controller 150 closes all of the valves in the substrate processing system 101 (step 1 shown in FIGS. 3 and 4).

At 354, the controller 150 opens the throttle valve 130 and the gate valve 132 and turns on the vacuum pump 136 to pump the processing chamber 100 to a base pressure Th1 (i.e., a first threshold pressure Th1), which is less than P1 (step 2 shown in FIGS. 3 and 4). For example, the base pressure Th1 may be near vacuum or slightly greater than vacuum (e.g., P1=100 Torr, Th1=10 or 5 Torr). At 356, once the pressure in the processing chamber 100 is less than or equal to the pressure Th1, the controller 150 closes the throttle valve 130 and the gate valve 132.

At 358, the controller 150 closes all of the HP valves (e.g., the valves 122) that are located downstream from the processing chamber 100 in the substrate processing system 101. Additionally, the controller 150 opens all of the LP valves (e.g., the valves 112, 116) that are located upstream from the processing chamber 100 (step 7 shown in FIGS. 3 and 4).

At 360, the controller 150 opens the air valve 138 to allow the atmospheric air (i.e., air from outside the processing chamber 100) to enter into the processing chamber 100. Additionally, the controller 150 opens the rough valve 134. The controller 150 turns on the vacuum pump 136 (if not on). The atmospheric air enters into the processing chamber 100 through the air valve 138, and pressure in the processing chamber 100, which is Th1 at the beginning of the fine purging (see beginning of step 7 shown in FIGS. 3 and 4), begins to increase.

At 362, to increase the pressure in the processing chamber 100, the controller 150 sets the opening of the throttle valve 130 to the first setting corresponding to a pressure Th2 (i.e., a second threshold pressure Th1) that is to be reached in the processing chamber 100 (step 8 shown in FIGS. 3 and 4). The pressure Th2 is greater than the pressure Th1 but less than the pressure P1 as shown in FIG. 4. For example, P1=100 Torr, Th1=10 or 5 Torr, and Th2=80 or 90 Torr as shown in FIG. 4. Due to the first setting of the throttle valve 130, the pressure in the processing chamber 100 continues to increase from Th1 to Th2. The vacuum pump 136, which is already turned on in step 360 (step 7 shown in FIGS. 3 and 4), continues to the pump the processing chamber 100. As shown in FIG. 4, 0<Th1<Th2<P1.

At 364, the controller 150 determines if the pressure in the processing chamber 100 has increased to Th2. At 366, controller 150 continues to monitor the pressure in the processing chamber 100. The throttle valve 130 remains at the first setting until the pressure in the processing chamber 100 has increased to the pressure Th2. The vacuum pump 136, which is already turned on in step 360 (step 7 shown in FIGS. 3 and 4), continues to the pump the processing chamber 100.

At 368, after the pressure in the processing chamber 100 has increased to Th2, to decrease the pressure in the processing chamber 100 from Th2 to Th1, the controller 150 sets the throttle valve 130 to the second setting corresponding to the pressure Th1 (i.e., the first threshold pressure Th1) that is to be reached in the processing chamber 100 (step 9 shown in FIGS. 3 and 4). The vacuum pump 136, which is already turned on in step 360 (step 7 shown in FIGS. 3 and 4), continues to the pump the processing chamber 100.

At 370, the controller 150 determines if the pressure in the processing chamber 100 has decreased to Th1. At 372, controller 150 continues to monitor the pressure in the processing chamber 100. The throttle valve 130 remains at the second setting until the pressure in the processing chamber 100 has decreased to the pressure Th1. The vacuum pump 136, which is already turned on in step 360 (step 7 shown in FIGS. 3 and 4), continues to the pump the processing chamber 100.

At 374, the controller 150 determines if a cycle comprising the steps 362-372 has been performed for a predetermined number of times or for a second specified (predetermined) period of time. Performing the cycle comprising the steps 362-372 the predetermined number of times or for the second specified (predetermined) period of time is sufficient to purge the HF from all of the LP valves (e.g., the valves 112, 116) and the associated manifolds (e.g., the manifolds 114, 118) that are located upstream from the processing chamber 100.

If the cycle comprising the steps 362-372 has not yet been performed the predetermined number of times or for the second specified (predetermined) period of time, the controller 150, the controller 150 repeats the cycle comprising the steps 362-372 for the predetermined number of times or for the second specified (predetermined) period of time (step 10 shown in FIGS. 3 and 4). The vacuum pump 136, which is already turned on in step 360 (step 7 shown in FIGS. 3 and 4), continues to the pump the processing chamber 100.

If the cycle comprising the steps 362-372 has been performed for the predetermined number of times or for the second specified (predetermined) period of time, at 376, the controller 150 closes all of the valves in the substrate processing system 101 and turns off the vacuum pump 136 (step 11 shown in FIGS. 3 and 4). At this point, the fine purging of the processing chamber 100 ends, and the HF in all of the LP valves (e.g., the valves 112, 116) and the associated manifolds (e.g., the manifolds 114, 118) that are located upstream from the processing chamber 100 in the substrate processing system 101 is purged.

The second specified (predetermined) amount of time for which the fine purging of the processing chamber 100 is performed is the LP (fine) purge Time2 described above with reference to FIG. 5 and is therefore not described again for brevity. Further, as described above with reference to FIG. 5, throughout the fine purging, the switch SW1 keeps the HP valves (e.g., the valves 122) that are located downstream from the processing chamber 100 closed and allows only the LP valves (e.g., the valves 112, 116) that are located upstream from the processing chamber 100 to remain open. Thus, the LP valves (e.g., the valves 112, 116) and the associated manifolds (e.g., the manifolds 114, 118) that are located upstream from the processing chamber 100 can be purged of the HF during the fine purging.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system for performing preventive maintenance of a processing chamber of a substrate processing system using atmospheric air, the system comprising:

a first plurality of valves and manifolds located downstream from the processing chamber of the substrate processing system;

a second plurality of valves and manifolds located upstream from the processing chamber of the substrate processing system; and a controller configured to perform the preventive maintenance of the processing chamber using the atmospheric air by:

initially purging the processing chamber and the first plurality of valves and manifolds while maintaining pressure in the processing chamber between a first pressure and a second pressure that is greater than the first pressure and less than atmospheric pressure; and subsequently purging the processing chamber and the second plurality of valves and manifolds while maintaining pressure in the processing chamber between the first pressure and a third pressure that is less than the first pressure.

2. The system of claim 1 wherein the controller is configured to remove halogen-containing residues from the processing chamber, the first plurality of valves and manifolds, and the second plurality of valves and manifolds by perform the preventive maintenance of the processing chamber using the atmospheric air.

3. The system of claim 1 wherein the controller is configured to perform the initial purging for a longer period of time than the subsequent purging.

4. The system of claim 1 wherein the controller is configured to close the second plurality of valves and open the first plurality of valves and manifolds to purge the first plurality of valves and manifolds while maintaining pressure in the processing chamber between the first pressure and the second pressure during the initial purging.

5. The system of claim 1 wherein the controller is configured to close the first plurality of valves and open the second plurality of valves and manifolds to purge the second plurality of valves and manifolds while maintaining pressure in the processing chamber between the first pressure and the third pressure during the subsequent purging.

6. The system of claim 1 wherein the controller is configured to:

perform the initial purging and the subsequent purging at a first time;

perform the initial purging and the subsequent purging at a second time that is subsequent to the first time; and perform only the subsequent purging one or more times between the first and second times.

7. A method of performing preventive maintenance of a processing chamber of a substrate processing system using atmospheric air, the method comprising:

initially opening a first plurality of valves located downstream from the processing chamber and closing a second plurality of valves located upstream from the processing chamber to perform the preventive maintenance while maintaining pressure in the processing chamber between a first pressure and a second pressure that is greater than the first pressure and less than atmospheric pressure;

purging the processing chamber and the first plurality of valves using the atmospheric air to perform the preventive maintenance while maintaining pressure in the processing chamber between the first pressure and the second pressure;

subsequently closing the first plurality of valves and opening the second plurality of valves to perform the preventive maintenance while maintaining pressure in the processing chamber between the first pressure and a third pressure that is less than the first pressure; and purging the processing chamber and the second plurality of valves using the atmospheric air to perform the preventive maintenance while maintaining pressure in the processing chamber between the first pressure and the third pressure.

8. The method of claim 7 wherein the purging of the processing chamber, the first plurality of valves, and the second plurality of valves comprises removing halogen-containing residues from the processing chamber, the first plurality of valves, the second plurality of valves, and manifolds associated with the first and second plurality of valves.

9. The method of claim 7 further comprising purging the processing chamber and the first plurality of valves for a longer period of time than purging the processing chamber and the second plurality of valves.

10. The method of claim 7 further comprising:

initially performing, at a first time, a first instance of the purging of the processing chamber, the first plurality of valves, and the second plurality of valves;

subsequently performing, at a second time, a second instance of the purging of the processing chamber, the first plurality of valves, and the second plurality of valves;

and performing only the purging of the processing chamber and the second plurality of valves one or more times between the first and second times.

11. A system for performing preventive maintenance of a processing chamber of a substrate processing system using atmospheric air, the system comprising:

a first plurality of valves and manifolds located downstream from the processing chamber;

a second plurality of valves and manifolds located upstream from the processing chamber;

a first valve to selectively flow the atmospheric air into the processing chamber;

a throttle valve and a second valve connected to each other in series and connected to the processing chamber;

a third valve connected across the throttle valve and the second valve;

a vacuum pump connected to the throttle valve and the second and third valves; and a controller configured to perform the preventive maintenance by controlling the vacuum pump, the throttle valve, and the first, second, and third valves to:

initially open the first plurality of valves and close the second plurality of valves while maintaining pressure in the processing chamber between a first pressure and a second pressure that is greater than the first pressure and less than atmospheric pressure;

purge the processing chamber and the first plurality of valves and manifolds using the atmospheric air;

subsequently close the first plurality of valves and open the second plurality of valves while maintaining pressure in the processing chamber between the first pressure and a third pressure that is less than the first pressure; and purge the processing chamber and the second plurality of valves and manifolds using the atmospheric air.

12. The system of claim 11 wherein the controller is configured to remove halogen-containing residues from the processing chamber, the first plurality of valves and manifolds, and the second plurality of valves and manifolds.

13. The system of claim 11 wherein the controller is configured to purge the processing chamber and the first plurality of valves and manifolds for a longer period of time than purging the processing chamber and the second plurality of valves and manifolds.

14. The system of claim 11 wherein the controller is configured to:

initially perform, at a first time, a first instance of the purging of the processing chamber, the first plurality of valves and manifolds, and the second plurality of valves and manifolds;

subsequently perform, at a second time, a second instance of the purging of the processing chamber, the first plurality of valves and manifolds, and the second plurality of valves and manifolds; and perform only the purging of the processing chamber and the second plurality of valves and manifolds one or more times between the first and second times.

15. The system of claim 11 wherein the controller is configured to:

close the throttle valve and the second valve and open the third valve in response to the pressure in the processing chamber being greater than or equal to the first pressure; and open the throttle valve and the second valve and close the third valve in response to the pressure in the processing chamber being less than the first pressure.

16. The system of claim 11 wherein the controller is configured to:

close the first and second plurality of valves, the throttle valve, and the first, second, and third valves;

open the throttle valve and the second valve;

pump, using the vacuum pump, the processing chamber to a first threshold pressure that is less than the first pressure and greater than the third pressure;

open the first valve and the first plurality of valves;

continue pumping the processing chamber and the first plurality of valves for a first predetermined period;

close the first valve after the first predetermined period; and pump, using the vacuum pump, the processing chamber to the first threshold pressure.

17. The system of claim 16 wherein the controller is configured to, after the first predetermined period:

close the first plurality of valves and open the second plurality of valves;

open the first and third valves;

a) pump the processing chamber using the vacuum pump with the throttle valve set to a second threshold pressure that is greater than the first threshold pressure and less than the first pressure;

b) in response to the pressure in the processing chamber reaching the second threshold pressure, pump the processing chamber using the vacuum pump with the throttle valve set to the first threshold pressure;

repeat a) and b) a predetermined number of times or for a second predetermined period that is less than the first predetermined period; and close the first and second plurality of valves, the throttle valve, and the first, second, and third valves.

18. The system of claim 11 wherein the controller is configured to:

purge the processing chamber and the first and second plurality of valves and manifolds at a first time;

purge the processing chamber and the first and second plurality of valves and manifolds at a second time that is subsequent to the first time; and between purging the processing chamber and the first and second plurality of valves and manifolds at the first and second times:

close the first and second plurality of valves, the throttle valve, and the first, second, and third valves;

open the throttle valve and the second valve;

pump, using the vacuum pump, the processing chamber to a first threshold pressure that is less than the first pressure and greater than the third pressure;

close the throttle valve and the second valve;

open the second plurality of valves;

open the first and third valves;

a) pump the processing chamber using the vacuum pump with the throttle valve set to a second threshold pressure that is greater than the first threshold pressure and less than the first pressure;

b) in response to the pressure in the processing chamber reaching the second threshold pressure, pump the processing chamber using the vacuum pump with the throttle valve set to the first threshold pressure;

repeat a) and b) a predetermined number of times or for a predetermined period; and close the first and second plurality of valves, the throttle valve, and the first, second, and third valves.

* * * * *